356-138. XR 3544801 SR

R. H. DYCK 3,544,801

MASK DESIGN FOR OPTICAL ALIGNMENT SYSTEMS

Filed May 1, 1969 2 Sheets-Sheet 1

INVENTOR.
RUDOLPH H. DYCK

BY Alan H. MacPherson

ATTORNEY

MASK DESIGN FOR OPTICAL ALIGNMENT SYSTEMS

Filed May 1, 1969 2 Sheets-Sheet 2

INVENTOR.
RUDOLPH H. DYCK
BY
Alan H. MacPherson
ATTORNEY

United States Patent Office 3,544,801
Patented Dec. 1, 1970

3,544,801

MASK DESIGN FOR OPTICAL ALIGNMENT SYSTEMS

Rudolph H. Dyck, Palo Alto, Calif., assignor to Fairchild Camera and Instrument Corporation, Syosset, N.Y., a corporation of Delaware Filed May 1, 1969, Ser. No. 821,025
Int. Cl. H01j *5/16, 39/12*
U.S. Cl. 250—237 13 Claims

ABSTRACT OF THE DISCLOSURE

Special alignment marks make it possible to accurately align two transparent objects without the necessity of accurately aligning a photodetector array with respect to either object. By making one alignment mark opaque to light over the boundaries between the several light sensing elements of the photodetector array, the photodetector array produces an output signal indicative only of the relative misalignment of the objects being aligned and, provided the boundaries between the light sensing elements of the photodetector remain beneath the opaque regions of the alignment mark, small mislocations of the photodetector relative to the alignment mark have no effect on the output signals from its light-sensitive elements.

BACKGROUND OF THE INVENTION

Field of the invention

This invention relates to the alignment of objects, and in particular to the automatic alignment of a first mask with respect to a second mask or of a semiconductor wafer with respect to a mask.

Prior art

In many manufacturing processes the automatic alignment of one object with respect to a second object is desirable. It is particularly desirable during the production of semiconductor devices to align automatically semiconductor wafers with the masks used to define the areas of these wafers to be etched, diffused, or otherwise operated on. Typically, because of the small sizes of both the wafers and the masks and the difficulty of automatically placing each mask on a wafer, the masks are both placed on, and aligned with, the wafers manually. An operator views each wafer and the overlying mask through a microscope. Adjustments in the relative positions of the wafer and the mask are made by the operator until satisfactory alignment of the two is obtained. Because of the inherent inaccuracies introduced by the human operator, the resulting defined areas of the wafer are often not located as accurately as desired.

Systems suitable for automatically aligning masks with underlying wafers have been proposed. One such system is disclosed in patent application Ser. No. 716,223, filed Mar. 26, 1968 by Howard E. Murphy entitled "Circuit for Determination of the Centroid of an Illuminated Area," and assigned to Fairchild Camera and Instrument Corporation, the assignee of this application. The structure disclosed in the Murphy application uses a so-called "quad detector," a photosensitive device containing four light sensing elements, each occupying one quadrant of the planar surface of the device, to determine whether or not a mask is properly aligned with a wafer. Murphy's system requires that the quad detector be itself aligned with the mask or the wafer. Thus, the accuracy obtainable by automatically aligning a mask with a wafer is somewhat reduced by the errors in aligning the quad detector with either the mask or the wafer.

SUMMARY OF THE INVENTION

This invention, on the other hand, overcomes the problem of accurately aligning the quad detector with either the mask or the wafer by providing a unique mask pattern which makes the alignment of the quad detector with the mask and/or the wafer unnecessary within a certain tolerance range. As a result, a mask and a wafer, once placed within a given relationship to the quad detector, are automatically aligned with respect to each other regardless of the relative position of the quad detector vis-a-vis the mask and/or the wafer. Consequently, both the speed and the accuracy of the resulting mask-wafer alignment is enhanced relative to the speed and accuracy of such alignments obtained by prior art alignment systems.

According to this invention, selectively shaped opaque registration mark, typically circular, is placed on a first object, typically a mask or a wafer. Then an endless opaque band, annular-shaped if the registration mark is circular, is formed on a second object, usually a mask. Both first and second objects are substantially transparent, at least to radiant energy at certain selected frequencies. Inside the opaque band is a transparent area. The inner circumference of the endless opaque band is larger than, but conforms to, the outer circumference of the registration mark on the first object. Placed within the opaque band, and contacting this band at four places, is an opaque cross. This opaque cross covers the boundaries between the four light sensing elements in the quad detector. Consequently, the quad detector does not have to be centered precisely beneath the centers of the registration mark and the opaque band. Rather, the quad detector can move relative to these centers so long as the boundaries between the four light sensing elements making up the quad detector remain covered by the opaque cross. So long as these boundaries are covered, each light-sensing element in the quad detector produces an output signal determined solely by the misalignment of the first and the second object. When the registration mark on the first object is precisely centered within the opaque band on the second object, the output signals from the four light sensing elements comprising the quad detector are equal and the two objects are aligned in two mutually perpendicular directions.

A second set of similar alignment marks on the two objects is necessary to align the two objects rotationally Because there is no need to align the quad detector with respect to the two objects being aligned, alignment speed is increased and alignment accuracy is significantly improved relative to the alignment speed and accuracy obtainable with prior art systems.

DETAILED DESCRIPTION

Figure 1A:
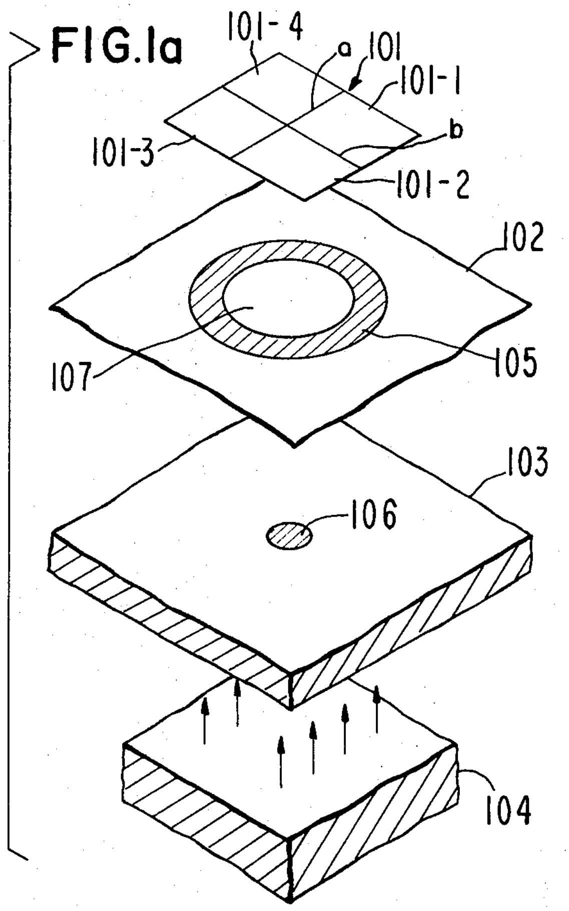
FIG. 1*a* shows, in exploded view, a quad detector, two masks to be aligned and a light source.

FIG. 1*a* shows an exploded view of a source 104 of substantially uniform collimated light together with two objects, 102 and 103, to be aligned relative to each other, and a photo-sensitive quad detector 101. Objects 102 and 103 will hereafter be referred to as masks. Mask 102 contains an opaque annular band 105 surrounding transparent region 107. Mask 103, to be aligned with mask 102, contains an opaque registration mark 106. Mask 103 might, for example, be a semiconductor wafer. Collimated light from source 104 is transmitted through masks 103 and 102 and detected by photodector 101.

Light source 104 typically consists of a source (not shown) of radiant energy together with a scrambled bundle of fibre optics. The scrambled fibre optics bundle mixes the radiant energy from various parts of the radiant energy source to make substantially uniform with location the radiant energy striking masks 102 and 103.

Desirably, a substantial part of the radiant energy from the source is in the infra-red region (i.e. possesses a wavelength greater than 1.0 micron) because intrinsic silicon, a common semiconductor, is substantially transparent to infrared energy. Thus when object 103 (FIG. 1*a*) is a silicon wafer, registration mark 106 must be substantially opaque to infrared energy. Such opaqueness is obtained by selectively doping the silicon in the region of mark 106 with either donor or acceptor impurities. These impurities absorb a significantly higher proportion of the infrared energy than does intrinsic silicon and thus are opaque to infrared energy relative to the adjacent undoped silicon.

Photodetector 101, a quad detector, contains four light-sensitive elements 101–1 through 101–4. Though these elements can be either light-sensitive transistors, diodes, photomultipliers, photoresistors or any other light-sensitive devices, for the description in this specification they will be assumed to be diodes. Typically the array of four photo-diodes comprising quad detector 101 is fabricated on a single silicon substrate by planar technology. Each photo-diode is located in, and fully occupies, a separate quadrant, as shown, and is separated from the two adjacent photo-diodes by boundaries *a* and *b*.

Figure 1B:
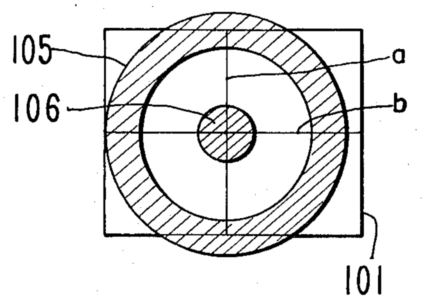
FIGS. 1*b* through 1*d* show registration marks of the prior art compared to the superimposed registration marks of this invention.

When registration mark 106 on mask 103 is precisely centered within opaque band 105 on mask 102, and when quad-detector 101 is likewise precisely centered with respect to registration mark 106 and opaque band 105, as shown in FIG. 1*b*, the output signals from photo diodes 101–1 through 101–4 are equal. Photo-diodes 101–1 through 101–4 produce equal output signals when equal areas of these photo-diodes receive equal amounts of light from source 104. An automatic wafer alignment system thus would detect no error signal and would not attempt to move mask 103 relative to mask 102. However, before quad detector 101 produces equal signals from each of its four photo-diodes the detector itself must be centered relative to opaque registration mark 106 and opaque band 105. That is, the intersection of the boundaries *a* and *b* of the four photo-diodes 101–1 through 101–4 must be beneath the centers of registration mark 106 and opaque band 105. Thus, unequal signals from photo-diodes 101–1 through 101–4 do not necessarily mean that masks 102 and 103 are improperly aligned; rather, quad detector 101 itself might be improperly aligned relative to masks 102 and 103.

Figure 1C:
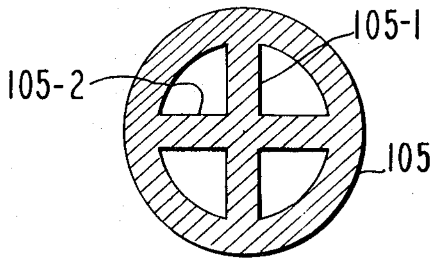

The alignment mark of this invention, shown in FIG. 1*c*, overcomes this deficiency. Unique to this alignment mark are mutually perpendicular opaque cross-arms 105–1 and 105–2 extending across two diameters of opaque annular band 105.

Now, when masks 102 and 103 are superimposed and aligned, and mask 102 has the alignment mark shown in FIG. 1*c*, a slight misalignment of quad detector 101 with respect to the centers of registration mark 106 and opaque band 105 has no effect on the output signals from photo-diodes 101–1 through 101–4. Rather, because boundaries *a* and *b* and a given area on both sides of each boundary are blanked out by cross-arms 105–1 and 105–2, quad-detector 101 can be slightly off center and even can be slightly rotated with respect to masks 102 and 103 and yet the output signals from each of its four photo-diodes will be equal, provided masks 102 and 103 are properly aligned.

Figure 1D:
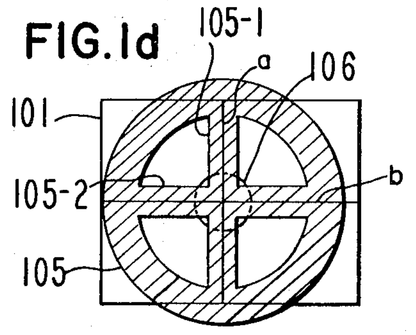

Thus, as shown in FIG. 1*d*, superposing registration mark 106 on both opaque band 105 with cross-arms 105–1 and 105–2, and quad detector 101, results in photo-diodes 101–1 through 101–4 producing equal output signals so long as photo-diode boundaries *a* and *b* lie beneath cross arms 105–1 and 105–2, and mark 106 is centered in opaque band 105. So long as the diameter of mark 106 is greater than the square root of two times the width of cross-arms 105–1 and 105–2, movement of registration mark 106 with respect to opaque band 105 will unbalance the currents from photo-diodes 101–1 through 101–4. But movement of quad detector 101 relative to masks 102 and 103 will have no effect on the output signals from photo-diodes 101–1 through 101–4 provided boundaries *a* and *b* remain beneath cross-arms 105–1 and 105–2.

Cross-arms 105–1 and 105–2 yield a second advantage. In the regions adjacent boundaries *a* and *b*, the current produced per unit area for a given incident light energy is somewhat non-uniform. These non-uiform response regions extend about 0.001 inch on either side of boundaries *a* and *b*. By blanking out these non-uniform regions with cross-arms 105–1 and 105–2, which typically are 0.005 inches wide, the accuracy of the automatic alignment of masks 105 and 103 is enhanced.

Figure 3A:
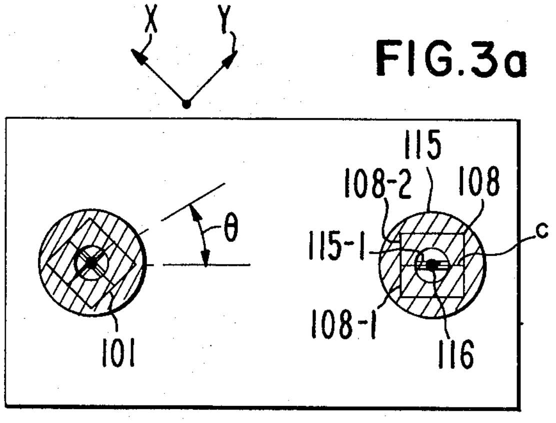
FIGS. 3*a* and 3*b* show two objects, using the alignment marks of this invention, being aligned.

It should be noted that with alignment marks 105 and 106, masks 102 and 103 can only be aligned with respect to relative displacement along the X and the Y axes at the center of registration mark 106 and opaque band 105. Small angular rotation about this center cannot be detected with just alignment marks 105 and 106. However, the addition of a second registration mark 116 on mask 103 and a second opaque endless band 115 on mask 102, as shown in FIG. 3*a*, overcomes this problem and allows, with the use of a simple dual photo-detector 108, the detection of relative angular displacement between masks 102 and 103. Dual photo-detector 108 is similar in construction to quad detector 101 but contains only two, not four, light sensitive elements.

In aligning two masks using the system shown in FIG. 3*a*, the two masks are aligned manually to within given tolerances. Then the two masks are automatically aligned such that the output signals from the four photo-diodes 101–1 through 101–4 of quad detector 101 are equal as are the output signals from the two photo-diodes 108–1 and 108–2 of dual photodetector 108. Satisfactory angular alignment is obtained when the output signal of photo-diode 108–1 equals the output signal of photodiode 108–2.

In accordance with the principles of this invention, opaque cross-arm 115–1 runs across one diameter of opaque band 115 so as to blank out the boundary *c* between photodiodes 108–1 and 108–2 when masks 102 and 103 are substantially angularly aligned. As with the quad detector, opaque cross-arm 115–1 makes unnecessary precise alignment of dual detector 108 with respect to masks 102 and 103. Rather so long as mask 102 is properly rotated with respect to mask 103, photodiodes 108–1 and 108–2 will produce equal output signals regardless of small misalignments of dual detector 108 with respect to either mask. All that is required is that boundary *c* remain beneath cross-arm 115–1 and that mark 116 be wider in diameter than the width of cross-arm 115–1.

Figure 3B:
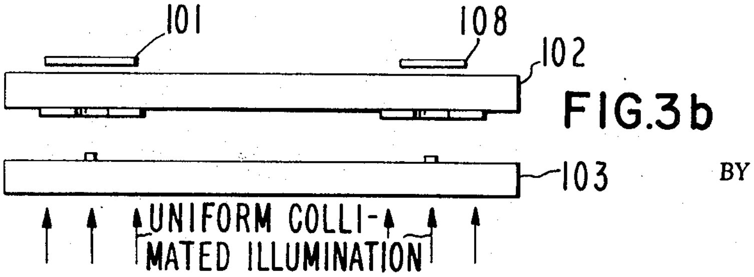

FIG. 3*b* shows a sectional view of masks 102 and 103 and photodetectors 101 and 108 as they would be approximately located during alignment. As shown, uniform collimated light is provided beneath each of the two photodetectors.

Figure 2:
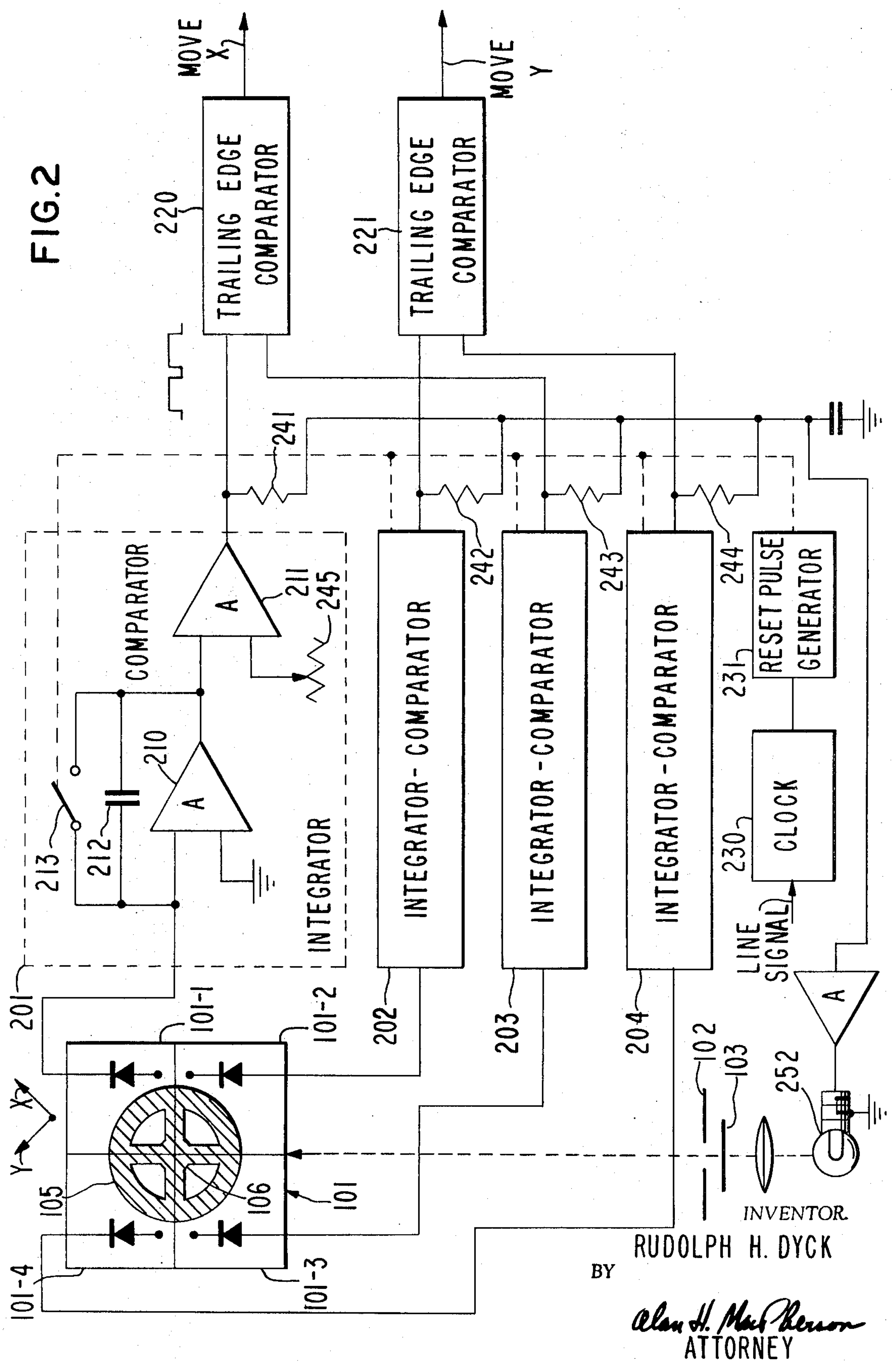
FIG. 2 shows an automatic wafer alignment system using the alignment marks of this invention.

FIG. 2 shows an automatic wafer alignment system using the alignment marks of this invention. As shown in FIG. 2, registration mark 106 on mask 103 is approximately centered within opaque band 105 on mask 102. Shown superimposed on these two is quad detector 101. The output signal from photodiode 101–1 is sent to integrator-comparator 201 where it is first integrated by operational amplifier 210 with capacitor 212 connected across its input and output leads, and then compared in differential amplifier 211 to a reference signal, illustratively shown as obtained from voltage divider 245. When the integrated output signal across capacitor 212 reaches the reference value, the output signal from differential amplifier 211 drops to zero. Shortly thereafter, a reset pulse from generator 231, activated by clock 230, closes switch 213 to discharge capacitor 212 prior to another integration cycle. Switch 213 may be mechanical, but preferably is an electronic switch. Integrator-comparators 212, 213 and 204, operate in the same manner on the output signals from corresponding photodiodes 101–2, 101–3 and 101–4.

To detect misalignment of masks of 103 and 102 in the X direction, the processed output signals from photodiodes 101–1 and 101–3 are compared in comparator 220.

Comparator 220 produces a difference signal by comparing the time of occurrence of the trailing edges of the pulses produced by integrator-comparators 201 and 203 connected to comparator 220. When the integrated voltage across capacitor 212 in integrator-comparator 201 equals the reference voltage from voltage divider 245, the output pulse from differential amplifier 211 drops to zero and trailing edge comparator 220 detects the time of occurrence of this drop. Likewise, the output voltage from integrator-comparator 203 will remain at a selected nonzero value until the integrated signal from photodiode 101–3 equals a corresponding reference signal. At this time, the output signal from integrator-comparator 203 will likewise drop to zero. The time of this drop will also be measured by comparator 220. The difference in the times of occurrence of the zero voltage outputs from integrator-comparators 201 and 203 is used by comparator 220 to generate an error signal. The magnitude of this error signal determines the amount of movement of mask 102 relative to mask 103, while the sign of this error signal determines the direction of this movement.

Comparator 221 operates in the same manner on output signals from integrator-comparators 202 and 204 to determine the magnitude and direction of any misalignment in the Y direction.

Obviously, the angular displacement of mask 102 relative to mask 103 can be determined by processing the output signals from photodiodes 108–1 and 108–2 in the same manner as the output signals from a given pair of photodiodes in quad detector 101 are processed to determine the X or Y misalignment of masks 102 and 103. Thus the system for automatically aligning the relative angular rotation of masks 102 and 103 will not be described in detail.

A more detailed description of apparatus suitable for use in aligning objects using the registration marks of this invention is disclosed in the above cited patent application of Howard E. Murphy. Furthermore, because apparatus for physically contacting and moving the two objects to be aligned is known in the art, such apparatus will not be described here.

While this invention has been described in terms of aligning masks, or a mask and a semiconductor wafer, it can be used to align a large variety of objects, provided these objects are transparent to at least some radiant energy.

What is claimed is:

1. Structure which comprises:

a first object containing a first registration mark, said first registration mark being substantially opaque to radiant energy at frequencies to which said first object is substantially transparent, said first registration mark having a first selected shape;

a second substantially transparent object containing a first endless opaque band, said band having an inner circumference which is larger than but conforms to the circumference of said first registration mark, said first opaque band being substantially opaque to radiant energy at the same frequencies as said first registration mark is opaque to said energy; and a first photo-detector comprising four light-sensitive elements, each light-sensitive element occupying one quadrant of said photo-detector, said photo-detector being arranged beneath said first and second objects such that when the first and second objects are aligned, the center of said photodetector is beneath both the center of said first registration mark on said first object, and the center of said first endless opaque band on said second object.

2. Structure as in claim 1 in which said first opaque band contains two opaque mutually-perpendicular cross-arms, each cross-arm extending across said first opaque band on a diameter of said opaque band, said cross-arms being superimposed above and thus preventing light from reaching both the boundaries between said light-sensitive elements and the regions adjacent these boundaries.

3. Structure as in claim 2 including means for producing radiant energy which passes through said first and second objects and is incident on said first photo-detector.

4. Structure as in claim 3 in which said first opaque registration mark is circular, and said first opaque endless band is annular shaped.

5. Structure as in claim 3 including in addition;

a second opaque registration mark on said first object, said second opaque registration mark possessing a circumference of a second selected shape;

a second opaque endless band on said second object, said second band surrounding and enclosing a transparent area on said second object, and containing one opaque cross-arm extending diametrically across the interior of said second band, said second opaque band possessing an inner circumference larger than, but substantially conforming to, the outer circumference of said second opaque registration mark such that when said first and second objects are superimposed with the center of said second opaque registration mark being directly in line with the center of said second opaque endless band, a transparent region of uniform width exists between said second opaque registration mark and said second opaque endless band, except where interrupted by said opaque cross-arm.

6. Structure as in claim 5 in which said first object is a semiconductor wafer, and said second object is a mask.

7. Structure as in claim 5 including in addition, a second photodetector containing two light sensitive elements each occupying one-half of the surface of said second photodetector, said second photodetector being placed beneath said second opaque registration mark and said second opaque endless band such that when said first and second objects are approximately rotationally aligned, the boundary between said two light-sensitive elements on said second photodetector array falls beneath the opaque cross-arm extending diametrically across the interior of said second opaque endless band.

8. Structure as in claim 7 including means for producing radiant energy which passes through said first and second objects and is incident on said second photoconductor.

9. Structure as in claim 8 in which said first photodetector is connected to means for determining the relative X and Y displacements of said first object relative to said second object; and said second photodetector is connected to means for determining the relative rotational displacement of said first and second objects about the center of said first registration mark.

10. Structure for aligning a first object relative to a second object which comprises:

a first and a second opaque registration mark on said first object, said first and second opaque registration marks possessing circumferences of a first selected shape;

a first and a second opaque endless band on said second object, said first and second opaque endless bands surrounding and completely enclosing corresponding transparent areas on said second object, and possessing inner circumferences larger than but substantially conforming to the outer circumferences of said first and second opaque registration marks respectively, and being located such that when said first and second objects are selectively superimposed, the centers of said first and second registration marks are directly beneath the centers of said first and second opaque endless bands, and a transparent region of uniform width exists between each of said opaque registration marks and its corresponding opaque endless band, said first opaque endless band containing two opaque and mutually perpendicular cross-arms extending diametrically across the interior of said band, and said second opaque endless band containing one opaque cross-arm extending diametrically across the interior of said second band;

a first planar photodetector array containing four light-sensitive elements, each light-sensitive element occupying one quadrant of said first photodetector, said first photodetector being arranged beneath said first and second objects such that when said first and second objects are approximately aligned, said first photodetector array is beneath both said first opaque registration mark on said first object and said first opaque endless band on said second object;

a second planar photodetector array containing two light-sensitive elements, each light-sensitive element occupying one half of the surface of said second photodetector, said second photodetector being arranged beneath said first and second objects, such that when said first and second objects are approximately aligned, the center of said second photodetector is approximately beneath the centers of both said second opaque registration mark on said first object and said second opaque endless band on said second object;

means for producing light which passes through said first and second objects and strikes said first and second photodetectors to thereby cause said four light-sensitive elements of said first planar photodetector array, and said two light-sensitive elements of said second photodetector array to generate output signals;

first means for processing the signals produced by the first and third light sensitive elements in said first planar photodetector array to produce a first error signal proportional to the relative misalignment of said first and second objects in a first direction;

second means for processing the output signals from said second and fourth light-sensitive elements in said first planar photodetector array to produce a measure of the relative misalignment of said first and second objects in a second direction perpendicular to the said first direction;

third means for processing the output signals from said first and second light sensitive elements in said second photodetector array for producing an output signal indicative of the magnitude and direction of any rotational misalignment of said first and second objects about the center of said first opaque registration mark; and means responsive to the output signals from said first, second and third means for processing, for correcting any misalignments between said first and said second objects.

11. A system of alignment marks for use in aligning a first substantially transparent object relative to a second substantially transparent object which comprises:

an opaque registration mark on said first object, said opaque registration mark possessing a circumference of a selected shape;

an opaque endless band on said second object, said band surrounding and completely enclosing a transparent area on said second object, said opaque endless band containing a selected number of opaque cross-arms extending diametrically across the interior of said band and possessing an inner circumference larger than, but which substantially conforms to, the outer circumference of said registration mark such that when said first and second objects are superimposed with the center of said registration mark being directly in line with the center of said opaque endless band, a transparent region of uniform width exists between said opaque registration mark and said opaque endless band except where interrupted by said opaque cross-arms.

12. Structure as in claim 11 where said selected number of opaque cross-arms comprises two opaque and mutually perpendicular cross-arms extending diametrically across the interior of said band.

13. Structure as in claim 11, where said selected number of opaque cross-arms comprises a single opaque cross-arm extending across one diameter of said band.

References Cited

UNITED STATES PATENTS

| | | | |
|---|---|---|---|
| 3,038,369 | 6/1962 | Davis | 250—204X |
| 3,207,904 | 9/1965 | Heinz | 250—202 |
| 3,299,273 | 1/1967 | Sturdevant | 250—237X |
| 3,309,958 | 3/1967 | Simon | 250—237X |
| 3,395,287 | 7/1968 | Rajac | 250—234X |
| 3,448,280 | 6/1969 | Blitchington et al. | 250—219X |
| 3,497,705 | 2/1970 | Adler | 250—237 |

JOHN KOMINSKI, Primary Examiner

E. R. LA ROCHE, Assistant Examiner

U.S. Cl. X.R.

250—209, 220; 356—138